United States Patent
Kim et al.

(10) Patent No.: US 10,714,361 B2
(45) Date of Patent: Jul. 14, 2020

(54) METHOD OF FABRICATING A SEMICONDUCTOR PACKAGE USING AN INSULATING POLYMER LAYER

(71) Applicant: Foundation for Research and Business, Seoul National University of Science and Technolgy, Seoul (KR)

(72) Inventors: Sung Dong Kim, Gyeonggi-do (KR); Ju Hwan Jung, Gyeonggi-do (KR)

(73) Assignee: FOUNDATION FOR RESEARCH AND BUSINESS, SEOUL NATIONAL UNIVERSITY OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/281,200

(22) Filed: Feb. 21, 2019

(65) Prior Publication Data

US 2019/0198354 A1     Jun. 27, 2019

(30) Foreign Application Priority Data

Dec. 21, 2017 (KR) .......................... 10-2017-0177502
Dec. 3, 2018 (KR) .......................... 10-2018-0153504

(51) Int. Cl.
*H01L 21/56* (2006.01)
*H01L 23/528* (2006.01)
(Continued)

(52) U.S. Cl.
CPC ............ *H01L 21/565* (2013.01); *H01L 21/56* (2013.01); *H01L 21/568* (2013.01); *H01L 23/3121* (2013.01); *H01L 23/5226* (2013.01); *H01L 23/5283* (2013.01); *H01L 24/09* (2013.01); *H01L 24/17* (2013.01); *H01L 21/561* (2013.01); *H01L 23/3128* (2013.01)

(58) Field of Classification Search
None
See application file for complete search history.

(56) References Cited

U.S. PATENT DOCUMENTS 5,457,070 A * 10/1995 Hirade .............. H01L 21/76802
257/E21.577
6,841,413 B2 * 1/2005 Liu .......................... H01L 24/11
438/106
(Continued)

FOREIGN PATENT DOCUMENTS

JP    2007-220886    8/2007
JP    2013-197382    9/2013
(Continued)

OTHER PUBLICATIONS

KR20030050950A, Jun et al, Machine Translation. (Year: 2003).*

*Primary Examiner* — Andres Munoz
(74) *Attorney, Agent, or Firm* — Stuart H. Mayer; Mayer & Williams PC

(57) ABSTRACT

A method of fabricating semiconductor packages includes forming an insulating polymer layer on a substrate to cover a plurality of conductive patterns on the substrate, planarizing the insulating polymer layer by pressing the insulating polymer layer downward by using at least one pressure member, and patterning the planarized insulating polymer layer to expose at least parts of the plurality of conductive patterns.

11 Claims, 6 Drawing Sheets

(51) Int. Cl.
    *H01L 23/00*     (2006.01)
    *H01L 23/31*     (2006.01)
    *H01L 23/522*     (2006.01)

(56)     References Cited

U.S. PATENT DOCUMENTS

| | | | | |
|---|---|---|---|---|
| 2012/0328784 | A1* | 12/2012 | Dolan | B41J 2/161 |
| | | | | 427/300 |
| 2013/0249075 | A1* | 9/2013 | Tateiwa | H05K 1/185 |
| | | | | 257/734 |
| 2018/0108613 | A1* | 4/2018 | Chen | H01L 21/561 |
| 2018/0308822 | A1* | 10/2018 | Lianto | H01L 21/02118 |

FOREIGN PATENT DOCUMENTS

| | | |
|---|---|---|
| KR | 1020030050950 | 6/2003 |
| KR | 1020150057516 | 5/2015 |
| KR | 1020170046387 | 5/2017 |

\* cited by examiner

METHOD OF FABRICATING A SEMICONDUCTOR PACKAGE USING AN INSULATING POLYMER LAYER

CROSS-REFERENCE TO RELATED PATENT APPLICATIONS

This application claims the benefit of Korean Patent Application No. 10-2017-0177502, filed on Dec. 21, 2017, and Korean Patent Application No. 10-2018-0153504, filed on Dec. 3, 2018, in the Korean Intellectual Property Office, the disclosure of which is incorporated herein in its entirety by reference.

BACKGROUND

1. Field

The present invention relates to semiconductor apparatuses and, more particularly, to semiconductor packages and a method of fabricating the same.

2. Description of the Related Art

Basically, semiconductor packages include a substrate such as a lead frame, a printed circuit board (PCB), or a circuit film, a semiconductor chip attached to the substrate, a conductive connection means for conductively connecting the substrate and the semiconductor chip, a molding compound resin for surrounding and protecting the semiconductor chip and the conductive connection means from an external environment, and an input/output means provided on the substrate to finally output a signal of the semiconductor chip.

Currently, packages having high integration levels and small sizes, weights, and thicknesses compared to the above-described basic packages are demanded and thus a chip scale packaging technology for fabricating packages close to a chip size by packaging chips in a wafer level is used. Examples of a chip scale package include a fan-in wafer level package in which input/output terminals for transmitting electrical signals, e.g., solder balls, are electrically connected within an area of each chip, and a fan-out wafer level package in which conductive lines extend to the outside of an area of a chip by using an interposer or the like and input/output terminals are provided on the extended part.

RELATED ART DOCUMENT

Patent Document

1. Korean Patent Publication No. 1020170046387 (entitled "Stacked type fan-out wafer level semiconductor package and manufacturing method thereof" and published on May 2, 2017)

SUMMARY

In general, a semiconductor chip fabricating process may not be easily applied to a semiconductor package fabricating process. As such, the present invention provides a method of fabricating semiconductor packages, the method being capable of increasing stability of a semiconductor package fabricating process and achieving price competitiveness. However, the scope of the present invention is not limited thereto.

According to an aspect of the present invention, there is provided a method of fabricating semiconductor packages, the method including forming an insulating polymer layer on a substrate to cover a plurality of conductive patterns on the substrate, planarizing the insulating polymer layer by pressing the insulating polymer layer downward by using at least one pressure member, and patterning the planarized insulating polymer layer to expose at least parts of the plurality of conductive patterns.

The at least one pressure member may include at least one roller, and the planarizing may include locally pressing the insulating polymer layer by rolling the at least one roller on the insulating polymer layer.

The forming of the insulating polymer layer may be performed based on a coating process using a coating solution added with a solvent, and the planarizing may be performed by rolling the at least one roller on the insulating polymer layer to expose at least a part of the insulating polymer layer to discharge the solvent from the insulating polymer layer.

The planarizing may be performed in a heated atmosphere to planarize and, at the same time, soft-bake the insulating polymer layer.

The planarizing may include locally heating the insulating polymer layer by inductively heating the conductive patterns by applying radio frequency (RF) power.

In the planarizing, the at least one roller may be in a heated state.

The planarizing may be performed by rolling the at least one roller on the insulating polymer layer by adding downward pressure to a weight of the at least one roller.

The insulating polymer layer may include a photosensitive polymer layer, and the patterning of the insulating polymer layer may include exposing and then developing the photosensitive polymer layer.

The planarizing may include pressing the insulating polymer layer downward by using at least one plate, and locally pressing the insulating polymer layer by rolling at least one roller on the insulating polymer layer.

The substrate may include a semiconductor wafer, the conductive patterns may include conductive pads or rewiring patterns, and the forming of the insulating polymer layer and the planarizing may be performed in a wafer level.

The substrate may include a mold wafer having a plurality of semiconductor chips mounted thereon, the plurality of conductive patterns may include rewiring patterns for connecting at least some of conductive pads of the plurality of semiconductor chips to outer sides of the plurality of semiconductor chips on the mold wafer, and the semiconductor packages may include fan-out wafer level packages (FOWLPs).

The planarizing may be performed by pressing the insulating polymer layer downward by using a plate.

In the planarizing, the plate may be in a heated state.

The planarizing may be performed by heating the substrate.

BRIEF DESCRIPTION OF THE DRAWINGS

The above and other features and advantages of the present invention will become more apparent by describing in detail embodiments thereof with reference to the attached drawings in which.

DETAILED DESCRIPTION

Figure 1:
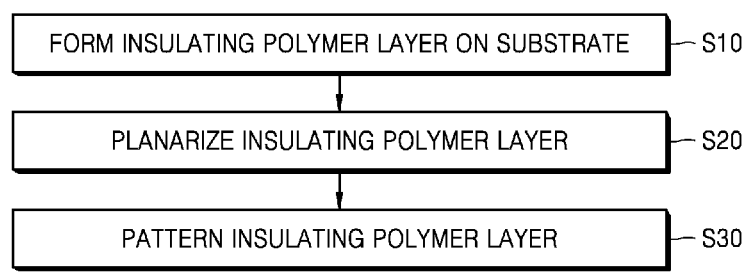
FIG. 1 is a flowchart of a method of fabricating semiconductor packages, according to an embodiment of the present invention.

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements may be exaggerated or reduced for convenience of explanation.

FIG. 1 is a flowchart of a method of fabricating semiconductor packages, according to an embodiment of the present invention.

Referring to FIG. 1, the method according to an embodiment of the present invention may include forming an insulating polymer layer on a substrate to cover a plurality of conductive patterns on the substrate (S10), planarizing the insulating polymer layer by pressing the insulating polymer layer downward by using at least one pressure member (S20), and patterning the planarized insulating polymer layer to expose at least parts of the plurality of conductive patterns (S30).

The insulating polymer layer may not be easily planarly formed on the substrate due to influence of lower patterns, e.g., the conductive patterns. The non-planar insulating polymer layer may be planarized by pressing the insulating polymer layer downward by using the at least one pressure member. As such, even when the insulating polymer layer is patterned or an additional material layer is formed on the insulating polymer layer in a subsequent process, planarity may be maintained and thus process reliability may be increased.

Various embodiments of a method of fabricating semiconductor packages will now be described in detail.

Figure 2A:
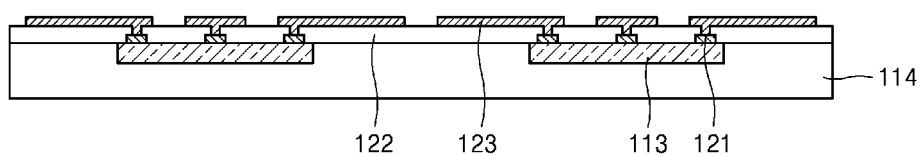
FIGS. 2A to 2F are cross-sectional views for describing a method of fabricating semiconductor packages, according to an embodiment of the present invention.

FIGS. 2A to 2F are cross-sectional views for describing a method of fabricating semiconductor packages, according to an embodiment of the present invention;

Referring to FIGS. 1 and 2A, a wafer level mounting structure in which a plurality of semiconductor chips 113 spaced apart from each other are positioned on a substrate 114 is prepared. For example, the substrate 114 may include a mold wafer having the semiconductor chips 113 mounted thereon. Herein, the mold wafer refers to a mold structure made of a molding material, e.g., an epoxy molding compound (EMC), in the form of a wafer, and equals a semiconductor wafer made of a semiconductor material in terms of shape but differs from the semiconductor wafer in terms of material.

The mold wafer may be produced, for example, as illustrated in FIGS. 3A to 3D.

Figure 3A:
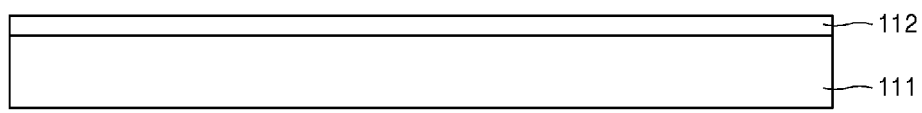
FIGS. 3A to 3D are cross-sectional views for describing an example of a process before rewiring patterns are formed in a method of fabricating semiconductor packages, according to an embodiment of the present invention.

Referring to FIG. 3A, tape 112 may be laminated on a carrier 111. The carrier 111 may include, for example, a steel or glass material and have a wafer shape for a wafer level process. The tape 112 may include, for example, detachable foam tape or ultraviolet (UV) tape.

Figure 3B:
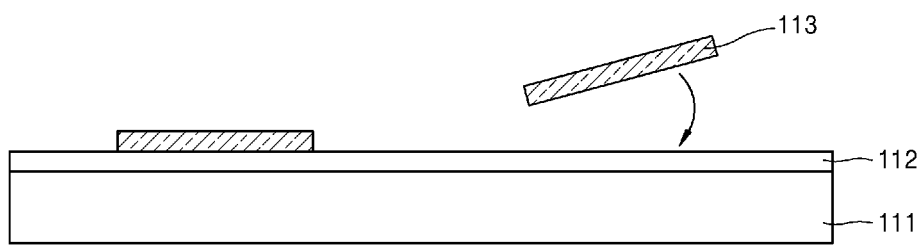
Figure 3C:
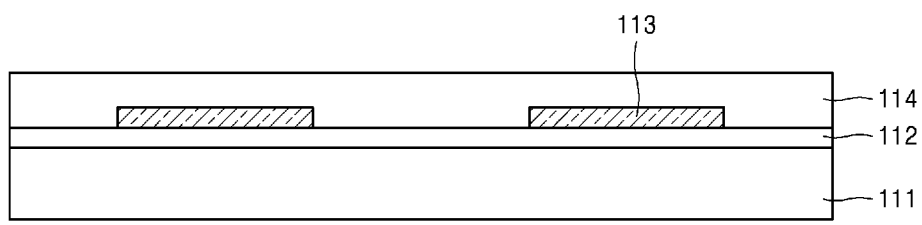

Referring to FIG. 3B, a plurality of semiconductor chips 113 may be positioned on the tape 112. Subsequently, referring to FIG. 3C, a substrate 114 may be formed by performing a wafer level molding process to cover the semiconductor chips 113. Therefore, the substrate 114 may be a mold structure made of a material such as an EMC.

Figure 3D:
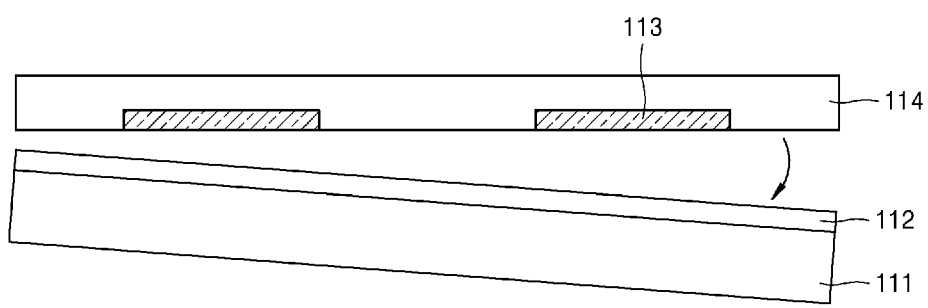

Referring to FIG. 3D, by detaching the tape 112, the substrate 114 on which the semiconductor chips 113 are molded may be separated from the carrier 111 having the tape 112 attached thereto. As such, the substrate 114 on which the semiconductor chips 113 are molded may be obtained.

Referring back to FIG. 2A, rewiring patterns 123 electrically connected to the semiconductor chips 113 may be formed on the substrate 114. The rewiring patterns 123 may include a conductive material, e.g., copper (Cu). For example, the rewiring patterns 123 may connect at least some of conductive pads 121 of the semiconductor chips 113 to outer sides of the semiconductor chips 113 on the substrate 114, i.e., on the mold wafer. For example, at least some of the rewiring patterns 123 may extend from the conductive pads 121 to outer sides of the semiconductor chips 113. An insulating layer 122 may be positioned between the rewiring patterns 123 and the substrate 114. In embodiments, conductive patterns may refer to the conductive pads 121, the rewiring patterns 123, or both.

Figure 2B:
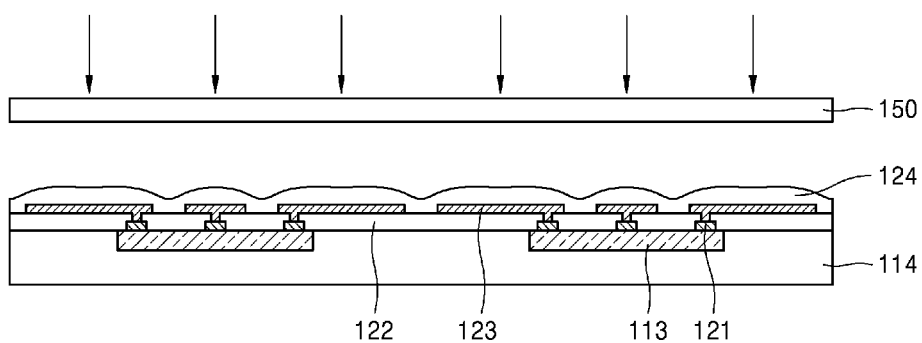

Referring to FIGS. 1 and 2B, an insulating polymer layer 124 may be formed on the substrate 114 to cover a plurality of conductive patterns, e.g., the rewiring patterns 123 (S10). For example, the insulating polymer layer 124 may be formed based on a coating process using a coating solution added with a solvent. For example, the insulating polymer layer 124 may include a photosensitive polymer layer.

The coating process may include, for example, a spin coating process. The insulating polymer layer 124 may not be easily planarly formed due to unevenness of a structure under the insulating polymer layer 124. For example, regions of the insulating polymer layer 124 corresponding to the rewiring patterns 123 may have a high level and other regions thereof between the rewiring patterns 123 may have a low level such that the insulating polymer layer 124 may have an uneven surface. Furthermore, the insulating polymer layer 124 may additionally have an uneven surface due to a structure under the rewiring patterns 123.

Figure 2C:
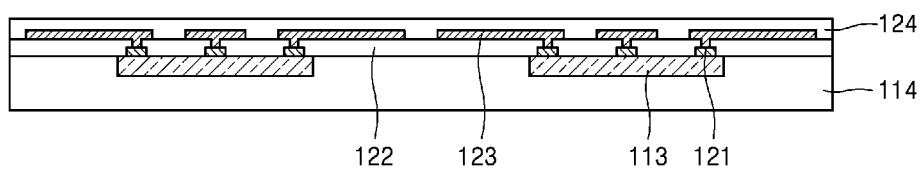

Referring to FIGS. 1, 2B, and 2C, the insulating polymer layer 124 may be planarized by pressing the insulating polymer layer 124 downward by using a pressure member such as a plate 150. The planarized insulating polymer layer 124 may have a uniform surface because the level of the regions corresponding to the rewiring patterns 123 equals the level of the other regions between the rewiring patterns 123. The planarization operation S20 may be performed in a heated atmosphere and thus may include planarizating and, at the same time, soft-baking the insulating polymer layer 124.

Various embodiments for making the heated atmosphere will now be described.

For example, when the insulating polymer layer 124 is planarized by pressing the insulating polymer layer 124 downward by using the plate 150 (S20), the plate 150 may be a heated plate. That is, the heated plate 150 may make the heated atmosphere in the planarization operation S20. Since the heated plate 150 is not in direct contact with the semiconductor chips 113, thermal degradation of the semiconductor chips 113 may be minimized.

As another example, the planarization operation S20 may be performed by heating the substrate 114. In this heated atmosphere, the insulating polymer layer 124 may be planarized and, at the same time, soft-baked. When surface unevenness of the insulating polymer layer 124 is serious, the photosensitive polymer layer may not be uniformly heated after being pressed using the heated plate 150. In this case, the substrate 114 may be heated to provide uniform heat distribution.

As another example, the planarization operation S20 may include locally heating and, at the same time, planarizing the insulating polymer layer 124 by inductively heating the conductive patterns, e.g., the conductive pads 121 or the rewiring patterns 123, by applying radio frequency (RF) power. In this case, since the insulating polymer layer 124 is locally heated, thermal degradation of the semiconductor chips 113 may be minimized.

According to a modification of the afore-described embodiment, the insulating polymer layer 124 may be planarized and, at the same time, soft-baked by performing the planarizing S200 in a heated atmosphere including an arbitrary combination of the above-described heat atmospheres. For example, the substrate 114 may be heated while heating the plate 150 or the conductive patterns may be inductively heated while heating the plate 150. As another example, the conductive patterns may be inductively heated while heating the substrate 114.

Figure 2D:
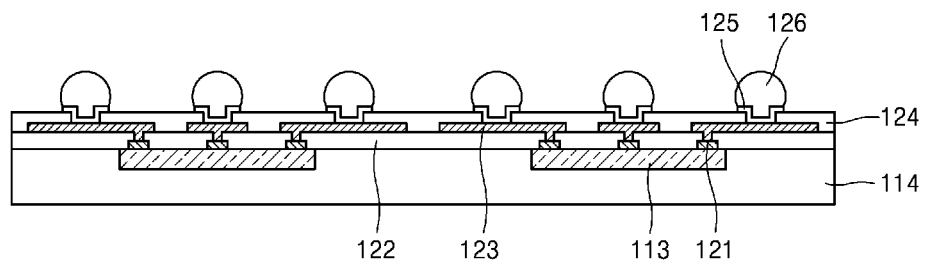

Referring to FIGS. 1 and 2D, the planarized insulating polymer layer 124 may be patterned (S30). For example, the planarized insulating polymer layer 124 may be patterned to expose at least parts of the conductive patterns, e.g., the rewiring patterns 123. For example, when the insulating polymer layer 124 includes the photosensitive polymer layer, the patterning process may be performed by exposing and then developing the photosensitive polymer layer.

Subsequently, a conductive underlayer 125 and electrical connection structures 126 may be formed on the exposed conductive patterns, e.g., the rewiring patterns 123. For example, the conductive underlayer 125 may include a barrier metal layer or an under bump layer. The electrical connection structures 126 may include structures capable of being electrically connected to the outside, e.g., solder bumps or solder balls.

In this structure, at least some of the conductive patterns, i.e., the rewiring patterns 123, may extend to outer sides of the semiconductor chips 113, and thus at least some of the electrical connection structures 126 may be positioned at the outer sides of the semiconductor chips 113. That is, the electrical connection structures 126 may be formed at the outer sides of the semiconductor chips 113 on the substrate 114 in an area larger than that of the semiconductor chips 113. A semiconductor package in which the electrical connection structures 126 extend to an outer side of the semiconductor chip 113 and are formed in a wafer level as described above may be called a fan-out wafer level package (FOWLP).

Figure 2E:
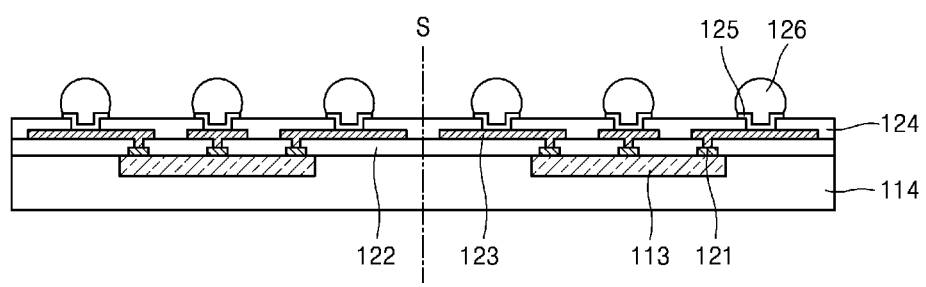
Figure 2F:
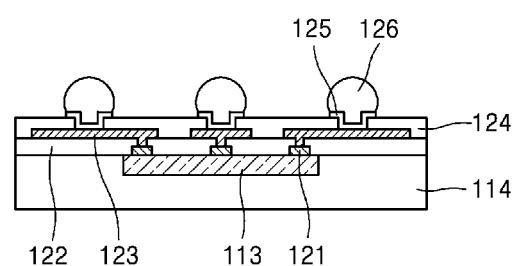

Subsequently, referring to FIGS. 2E and 2F, semiconductor packages may be fabricated by performing a sawing (S) process along a dicing region to individualize the semiconductor chips 113.

In this FOWLP process, after the insulating polymer layer 124 covering the rewiring patterns 123 is formed, the insulating polymer layer 124 needs to be planarized before a subsequent photolithography process. Particularly, the planarization process is more significant when the insulating polymer layer 124 occupies a large area to the outside of the area of the semiconductor chip 113 as in the FOWLP. In general, the planarization process may be implemented using chemical mechanical polishing (CMP) but production costs increase in a wet environment. On the contrary, in the above-described method of fabricating semiconductor packages, since the insulating polymer layer 124 may be effectively planarized without using CMP and a soft-bake process may not be separately performed, reduction in production costs and a production time may be expected.

Figure 4:
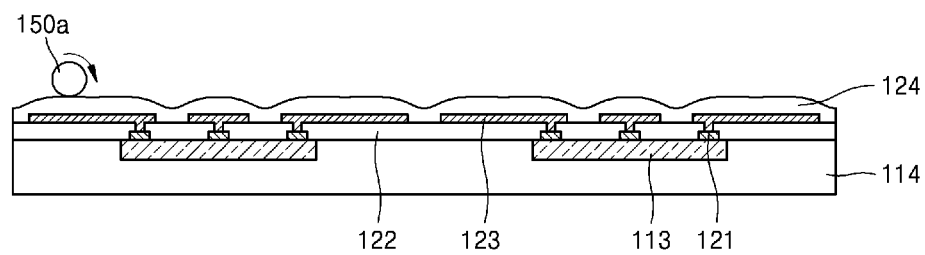
FIG. 4 is a cross-sectional view for describing a method of fabricating semiconductor packages, according to another embodiment of the present invention.

FIG. 4 is a cross-sectional view for describing a method of fabricating semiconductor packages, according to another embodiment of the present invention. The current embodiment is partially modified from the method described above in relation to FIGS. 2A to 2F, and thus repeated descriptions thereof will not be provided herein.

Referring to FIG. 4, at least one roller 150a may be used instead of the plate 150 of FIG. 2B in the planarization operation S20 of FIG. 1. That is, the planarization operation S20 may be performed by locally pressing the insulating polymer layer 124 by rolling the at least one roller 150a on the insulating polymer layer 124. Furthermore, in the planarization operation S20, the roller 150a may repeatedly reciprocate on the insulating polymer layer 124 until desired planarization is achieved. The roller 150a may be provided in a singular or plural number, and the scope of the current embodiment is not limited to the number of rollers 150a.

For example, when the insulating polymer layer 124 is formed based on a coating process using a coating solution added with a solvent, the planarization operation S20 may be performed by rolling the roller 150a on the insulating polymer layer 124 to expose at least a part of the insulating polymer layer 124 to discharge the solvent from the insulating polymer layer 124. When the insulating polymer layer 124 is pressed using the plate 150 as illustrated in FIG. 2B, the solvent may not be easily discharged from the insulating polymer layer 124. However, when the roller 150a moves on the insulating polymer layer 124, since the insulating polymer layer 124 is locally pressed by the roller 150a and then is exposed, the solvent may be easily discharged from the insulating polymer layer 124.

When the planarization operation S20 is performed in a heated atmosphere, planarization and soft-baking may be simultaneously performed and thus discharge of the solvent may be promoted. For example, the heated atmosphere may be made by heating the roller 150a or by locally heating the insulating polymer layer 124 by inductively heating the conductive patterns, e.g., the conductive pads 121 or the rewiring patterns 123, by applying RF power. A description of how to make the heated atmosphere is provided above in the previous embodiment described above in relation to, for example, FIG. 2B.

Furthermore, the planarization operation S20 may be performed by rolling the roller 150a on the insulating polymer layer 124 by adding downward pressure to the weight of the roller 150a. As such, the insulating polymer layer 124 may be rapidly planarized by applying pressure to the insulating polymer layer 124 with a weight greater than the weight of the roller 150a.

In a modified example of the current embodiment, planarization using the roller 150a may be performed after planarization using the plate 150 of FIG. 2B. That is, the planarization operation S20 may sequentially include pressing the insulating polymer layer 124 downward by using the plate 150 for a predetermined time, and locally pressing the insulating polymer layer 124 by rolling the roller 150a on the insulating polymer layer 124. In this case, the uniformly pressing effect using the plate 150 and the solvent discharging effect during the locally pressing process using the roller 150a may be achieved at the same time.

In the method according to the current embodiment, since the insulating polymer layer 124 may be effectively planarized without using CMP and a soft-bake process may not be separately performed, production costs and a production time may be reduced.

Figure 5A:
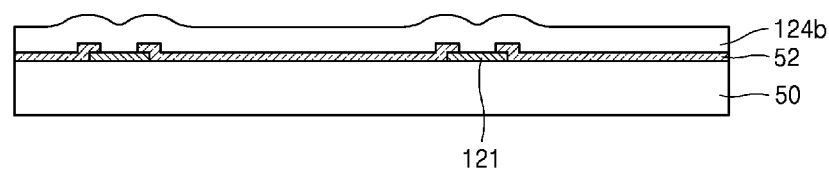
FIGS. 5A to 5C are cross-sectional views for describing a method of fabricating semiconductor packages, according to another embodiment of the present invention.
Figure 5B:
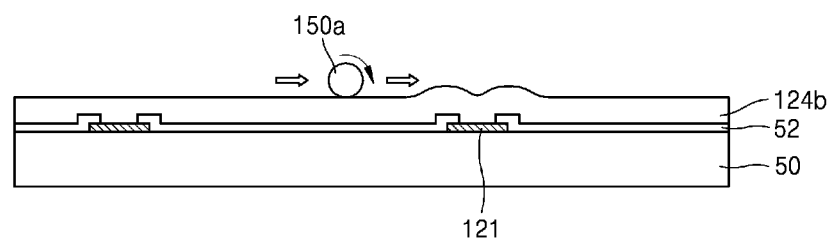
Figure 5C:
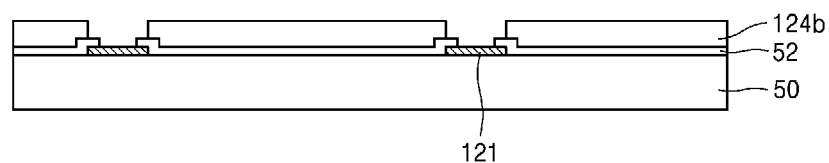

FIGS. 5A to 5C are cross-sectional views for describing a method of fabricating semiconductor packages, according to another embodiment of the present invention.

Referring to FIG. 5A, an insulating polymer layer 124b may be formed on a substrate 50 to cover a plurality of conductive patterns, e.g., conductive pads 121 (S10 of FIG. 1). A description of the insulating polymer layer 124b equals that of the insulating polymer layer 124, which is provided above in relation to FIG. 2B.

In the current embodiment, unlike FIGS. 2A to 2F, the substrate 50 may include a semiconductor wafer. In this case, semiconductor chips may be formed in the semiconductor wafer, and the conductive pads 121 may be output pads of the semiconductor chips. Therefore, the substrate 50 may refer to a structure in which elements for forming semiconductor devices on the semiconductor wafer, e.g., doped regions, gate electrodes, metal wires, and an insulating layer, are provided. Furthermore, an upper insulating layer 52 for exposing the conductive pads 121 may be added on the substrate 50. The upper insulating layer 52 may also be called a passivation layer.

Referring to FIG. 5B, the insulating polymer layer 124b may be planarized by locally pressing the insulating polymer layer 124b by rolling at least one roller 150a on the insulating polymer layer 124b (S20 of FIG. 1). A description of the planarization operation S20 using the roller 150a is provided above in relation to FIG. 4.

Referring to FIG. 5C, the planarized insulating polymer layer 124b may be patterned (S30 of FIG. 1). A description of the patterning operation is provided above in relation to FIG. 2D. Thereafter, referring to FIGS. 2E and 2F, a subsequent process for fabricating semiconductor packages may be performed.

According to the current embodiment, semiconductor packages may be fabricated using a wafer level packaging method. In this case, semiconductor packages may be fabricated using a wafer level packaging method on a semiconductor wafer without using a separate handling wafer. In the method according to the current embodiment, when semiconductor packages are fabricated in a wafer level, since the insulating polymer layer 124b may be effectively planarized without using CMP and a soft-bake process may not be separately performed, production costs and a production time may be reduced.

Figure 6:
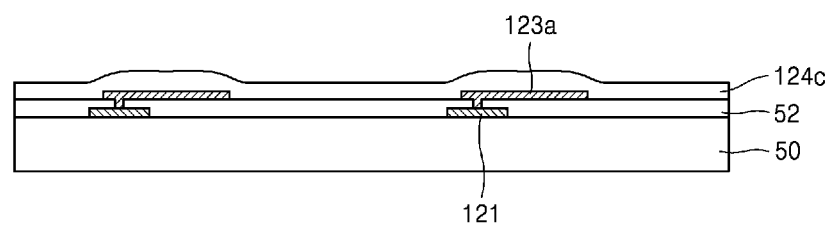
FIG. 6 is a cross-sectional view of a modified example of the semiconductor packages of FIG. 5A.

FIG. 6 is a cross-sectional view of a modified example of the semiconductor packages of FIG. 5A.

Referring to FIG. 6, an insulating polymer layer 124c may be formed on a substrate 50 to cover a plurality of conductive patterns, e.g., rewiring patterns 123a (S10 of FIG. 1). In the current embodiment, the substrate 50 may include a semiconductor wafer and the rewiring patterns 123a may be formed on the substrate 50 to be electrically connected to conductive pads 121. A description of the insulating polymer layer 124c equals that of the insulating polymer layer 124, which is provided above in relation to FIG. 2B.

Subsequently, referring to FIG. 2B or 5B, the insulating polymer layer 124c may be planarized by pressing the insulating polymer layer 124c downward by using the plate 150 of FIG. 2B or the roller 150a of FIG. 5B. Then, referring to FIGS. 2D to 2F, subsequent processes for fabricating semiconductor packages may be performed.

In the method according to the current embodiment, when semiconductor packages are fabricated in a wafer level, since the insulating polymer layer 124c may be effectively planarized without using CMP and a soft-bake process may not be separately performed, production costs and a production time may be reduced.

As described above, according to an embodiment of the present invention, a method of fabricating semiconductor packages, the method being capable of effectively planarizing a polymer layer without using a complex chemical mechanical polishing (CMP) process requiring high costs may be implemented. However, the scope of the present invention is not limited to the above effect.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A method of fabricating semiconductor packages, the method comprising:
    forming an insulating polymer layer on a substrate to cover a plurality of conductive patterns on the substrate;
    planarizing the insulating polymer layer by pressing the insulating polymer layer downward by using at least one pressure member;
    patterning the planarized insulating polymer layer to expose at least parts of the plurality of conductive patterns;
    wherein the at least one pressure member comprises at least one roller,
    wherein the planarizing comprises locally pressing the insulating polymer layer by rolling the at least one roller on the insulating polymer layer;
    wherein the forming of the insulating polymer layer is performed based on a coating process using a coating solution added with a solvent, and
    wherein the planarizing is performed by rolling the at least one roller on the insulating polymer layer to expose at least a part of the insulating polymer layer to discharge the solvent from the insulating polymer layer.

2. The method of claim 1, wherein the planarizing is performed in a heated atmosphere to planarize and, at the same time, soft-bake the insulating polymer layer.

3. The method of claim 1, wherein, in the planarizing, the at least one roller is in a heated state.

4. The method of claim 1, wherein the planarizing is performed by rolling the at least one roller on the insulating polymer layer by adding downward pressure to a weight of the at least one roller.

5. The method of claim 1, wherein the insulating polymer layer comprises a photosensitive polymer layer, and
    wherein the patterning of the insulating polymer layer comprises exposing and then developing the photosensitive polymer layer.

6. The method of claim 1, wherein the substrate comprises a semiconductor wafer,
    wherein the plurality of conductive patterns comprise conductive pads or rewiring patterns, and wherein the forming of the insulating polymer layer and the planarizing are performed in a wafer level.

7. The method of claim 1, wherein the substrate comprises a mold wafer having a plurality of semiconductor chips mounted thereon, wherein the plurality of conductive patterns comprise rewiring patterns for connecting at least some of conductive pads of the plurality of semiconductor chips to outer sides of the plurality of semiconductor chips on the mold wafer, and wherein the semiconductor packages comprise fan-out wafer level packages (FOWLPs).

8. A method of fabricating semiconductor packages, the method comprising:

forming an insulating polymer layer on a substrate to cover a plurality of conductive patterns on the substrate;

planarizing the insulating polymer layer by pressing the insulating polymer layer downward by using at least one pressure member;

patterning the planarized insulating polymer layer to expose at least parts of the plurality of conductive patterns and;

wherein the planarizing comprises locally heating the insulating polymer layer by inductively heating the plurality of conductive patterns by applying radio frequency (RF) power.

9. A method of fabricating semiconductor packages, the method comprising:

forming an insulating polymer layer on a substrate to cover a plurality of conductive patterns on the substrate;

planarizing the insulating polymer layer by pressing the insulating polymer layer downward by using at least one pressure member;

patterning the planarized insulating polymer layer to expose at least parts of the plurality of conductive patterns, wherein the planarizing comprises:

pressing the insulating polymer layer downward by using at least one plate; and locally pressing the insulating polymer layer by rolling at least one roller on the insulating polymer layer.

10. The method of claim 9, wherein, in the planarizing, the plate is in a heated state.

11. The method of claim 9, wherein in the planarizing, the substrate is heated.

* * * * *